United States Patent [19]
Kimura et al.

[11] Patent Number: 5,781,576
[45] Date of Patent: Jul. 14, 1998

[54] SEMICONDUCTOR LASER DEVICE AND OPTICAL DISK DRIVE

[75] Inventors: Katsuhiko Kimura; Shozo Saegusa, both of Ibaraki-ken; Masaru Muranishi, Hachioji, all of Japan

[73] Assignee: Hitachi, Ltd., Tokyo, Japan

[21] Appl. No.: 697,002

[22] Filed: Aug. 16, 1996

[30] Foreign Application Priority Data

Sep. 19, 1995 [JP] Japan ................. 7-239411

[51] Int. Cl.$^6$ ........................................... H01S 3/18
[52] U.S. Cl. ................. 372/45; 372/43; 356/359
[58] Field of Search ........................ 372/43, 45; 385/31; 356/359; 369/44.13; 257/365

[56] References Cited

U.S. PATENT DOCUMENTS

| | | | |
|---|---|---|---|
| 4,365,323 | 12/1982 | Heemskerk et al. | |
| 4,996,169 | 2/1991 | Lee | 372/43 |
| 5,039,191 | 8/1991 | Myszka | 385/31 |
| 5,157,459 | 10/1992 | Oono et al. | |
| 5,212,699 | 5/1993 | Masuko et al. | 372/43 |
| 5,216,729 | 6/1993 | Berger et al. | 385/31 |
| 5,521,754 | 5/1996 | Nitta et al. | 372/43 |

FOREIGN PATENT DOCUMENTS

| | | |
|---|---|---|
| 0 354 141 A2 | 2/1990 | European Pat. Off. |
| 0 537 904 A2 | 4/1993 | European Pat. Off. |
| 53-26837 | 2/1988 | Japan |
| A-6-295457 | 10/1994 | Japan |
| A-7-65397 | 3/1995 | Japan |

OTHER PUBLICATIONS

"Laser Diode with Integrated Electronic Beam Steering", IBM Technical Disclosure Bulletin, vol. 36, No. 7, Jul. 1993, pp. 147–148.

Primary Examiner—Rodney B. Bovernick
Assistant Examiner—Yisun Song
Attorney, Agent, or Firm—Antonelli, Terry, Stout & Kraus, LLP

[57] ABSTRACT

An optical disk drive has an aberration detector and an aberration correction circuit. A semiconductor laser device made of semiconductor crystals constituting a semiconductor laser light source includes an active layer for performing light amplification through current injection and guiding light in waveguide, a reflection member for reflecting light into said active layer, and a top electrode and a bottom electrode used for current injection to the active layer, wherein the top electrode is divided into a main electrode and a plurality of subsidiary electrodes, and injection current to the subsidiary electrodes is controlled so as to correct an aberration generated at an optical focussing system and an optical disk.

2 Claims, 13 Drawing Sheets

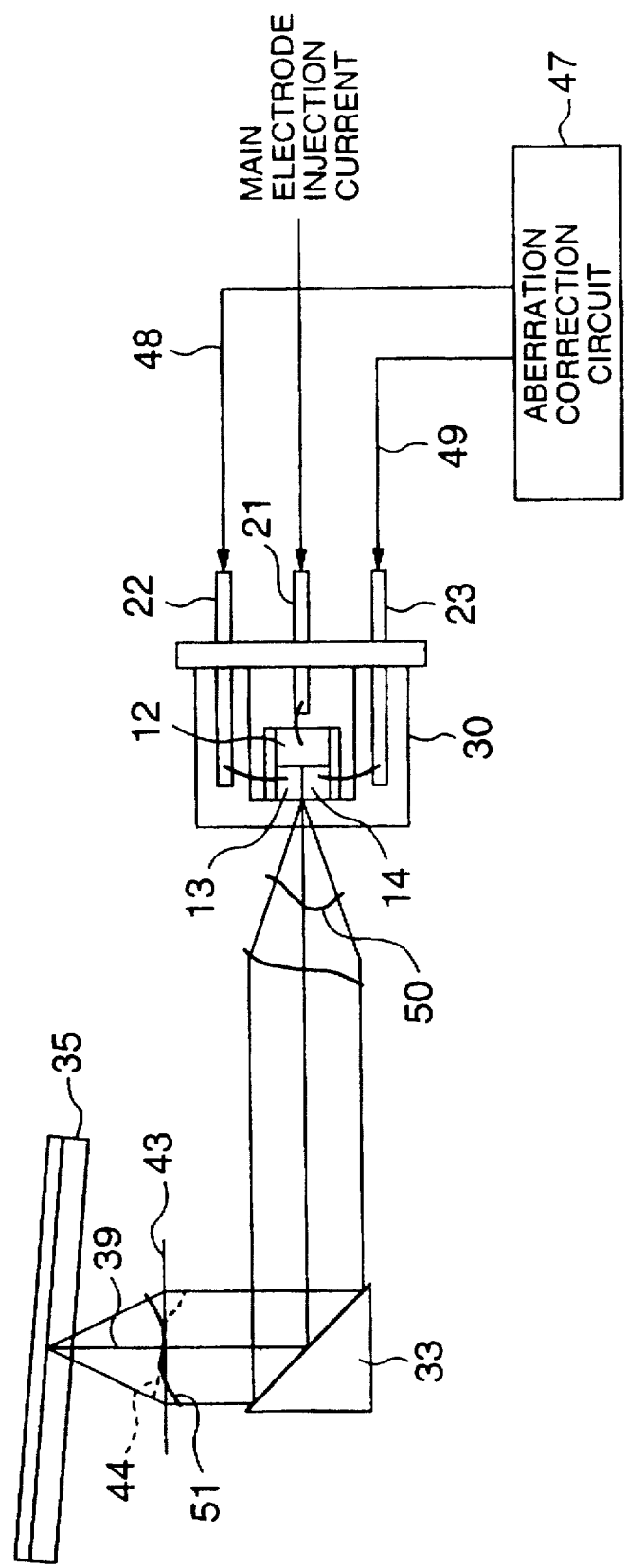

5,781,576

1

SEMICONDUCTOR LASER DEVICE AND OPTICAL DISK DRIVE

BACKGROUND OF THE INVENTION

1. Field of the Invention

The present invention relates to a semiconductor laser device capable of changing the shape of radiation wave front. The present invention also relates to an optical disk drive with such a semiconductor laser device, and an optical axis adjusting method using such a semiconductor laser device.

2. Description of the Related Art

High density recording has long been desired for optical disk drives used with compact disks and computer storages. As a high density recording method, it has been studied to increase a numerical aperture of an objective lens so as to improve a resolution. However, as the numerical aperture of an objective lens increases, the influence of coma to be caused by an inclination between the recording surface of an optical disk and the optical axis of an objective lens greatly increases and the signal read/write characteristics are adversely affected. The coma W to be caused by an inclination between an optical disk and the optical axis of an objective lens is given by the following equation (1) by using the polar coordinates (r, φ) of the principal surface of the objective lens.

$$W = (NA)^3 \times (r/a)^3 \cos\phi \times [dn^2(n^2-1) \sin\theta \cos\theta]/[2(n^2-\sin^2\theta)^{5/2}] \quad (1)$$

where d represents a thickness of the disk substrate, n represents a refractive index of the disk substrate, θ represents an inclination angle of the disk substrate, NA represents a numerical aperture of the objective lens, and a represents an effective radius of the objective lens. The coma therefore increases in proportion with the objective lens numerical aperture raised to the third power and the disk inclination angle. As the coma increases, the diameter of a spot focussed on an optical disk increases and an error of read/write may occur. It is therefore necessary to correct the disk inclination by some means in order to increase the objective lens numerical aperture for high density recording. A means in which transparent substrates having different phase differences are selectively inserted in an optical path (JP-A-6-295457), a means in which an objective lens is mechanically inclined (JP-A-7-65397), or other means have been proposed heretofore as disk inclination correcting methods.

However, with the above conventional techniques, new optical components are additionally used or a mechanism of mechanically moving the lens is required. The system therefore becomes complicated and expensive.

SUMMARY OF THE INVENTION

It is an object of the present invention to provide a semiconductor laser device, an optical disk drive, and an optical axis adjusting method, capable of readily correcting an inclination of an optical disk without complicating the system even if the numerical aperture of an objective lens is increased for high density recording of the optical disk.

In order to achieve the above object, the present invention provides a semiconductor laser device made of semiconductor crystals having an active layer for performing light amplification through current injection and guiding light in a waveguide, a reflection member for reflecting light into the active layer, and a top electrode and a bottom electrode used for current injection to the active layer, wherein current is injected from the top electrode to the bottom electrode to emit laser radiation in the direction along the optical axis of the waveguide in the active layer, characterized in that the top electrode is divided into a main electrode and a plurality of subsidiary electrodes divided along the optical axis of the waveguide in the active layer, and current is injected independently into the main electrode and each of the plurality of the subsidiary electrodes.

With the semiconductor laser device constructed as above, by controlling current injection into the main electrode and each of the plurality of subsidiary electrodes, the shape of a laser radiation wave front can be changed easily. This control is applicable both to a semiconductor laser device emitting laser radiation in the direction along the optical axis of the waveguide in the active layer and to a semiconductor laser device emitting laser radiation in the direction perpendicular to the junction surface of semiconductor crystals.

If such a semiconductor laser device is used as a semiconductor laser light source of an optical disk drive, an aberration to be caused by the optical disk inclination can be corrected by changing the shape of a laser radiation wave front through control of a current injection amount of the semiconductor laser light source in accordance with the inclination angle between the optical disk and the optical axis of an objective lens. Accordingly, even if the objective lens numerical aperture is increased, the inclination of an optical disk can be easily corrected and a high density optical disk drive can be realized.

BRIEF DESCRIPTION OF THE DRAWINGS

FIG. 7 is a diagram illustrating a change in the shape of a radiation wave front in an optical disk drive.

DETAILED DESCRIPTION OF THE PREFERRED EMBODIMENTS

Embodiments of the invention will be described with reference to the accompanying drawings.

Figure 1:
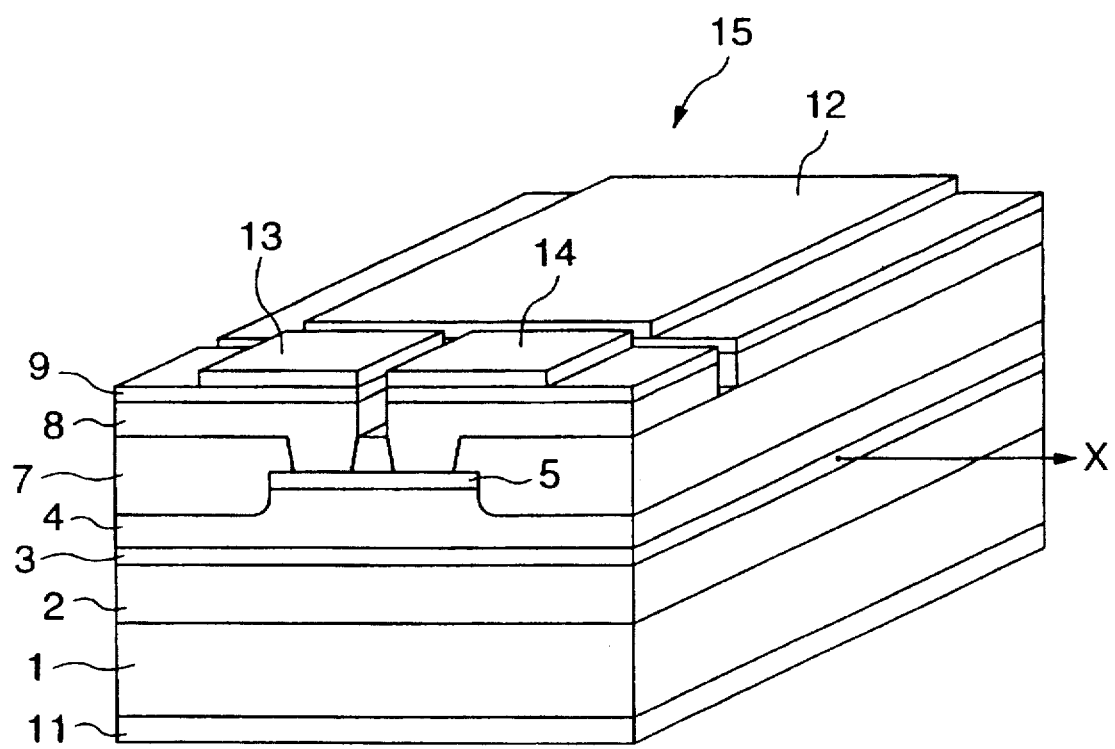
FIG. 1 is a diagram showing the overall structure of a semiconductor laser device according to an embodiment of the invention.

FIG. 1 is a diagram showing the overall structure of a semiconductor laser device according to an embodiment of the invention.

Referring to FIG. 1, on an n-GaAs substrate 1, a clad layer 2 of n-AlGaAs is formed. On this clad layer 2, a multiple quantum well active layer 3 of AlGaAs and a clad layer 4 of p-AlGaAs are laminated. On the clad layer 4, a p-GaAs contact layer 5 and an n-GaAs block layer 7 are formed. A p-AlGaAs buried layer 8 is formed in contact with the p-GaAs contact layer 5. Over the p-AlGaAs buried layer 8, subsidiary electrodes 13 and 14 and a main electrode 12 are formed with a p-GaAs cap layer 9 being interposed therebetween. On the bottom surface of the n-GaAs substrate 1, a bottom electrode 11 is formed.

With reference to FIGS. 2A to 2F, the method of manufacturing a semiconductor laser device having the structure shown in FIG. 1 will be described.

Figure 2A:
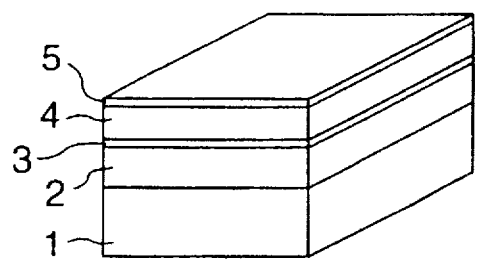
FIGS. 2A to 2F are diagrams illustrating the processes of manufacturing the semiconductor laser device shown in FIG. 1.
Figure 2B:
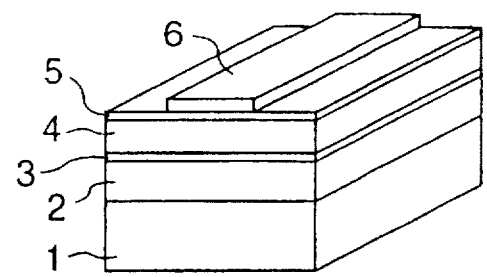
Figure 2C:
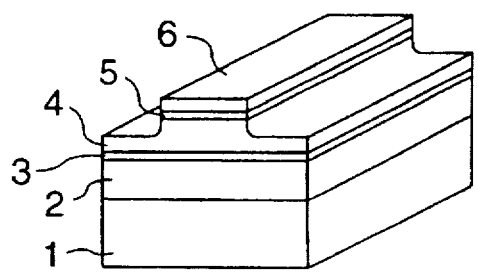

First, as shown in FIG. 2A, on the n-GaAs substrate 1, crystals of the n-AlGaAs clad layer 2, AlGaAs multiple quantum well active layer 3, p-AlGaAs clad layer 4, and p-GaAs contact layer 5 are sequentially grown. Next, as shown in FIG. 2B, an $SiO_2$ film 6 of a stripe shape is formed on the p-GaAs contact layer 5 through chemical vapor deposition and photolithography. As shown in FIG. 2C, by using this $SiO_2$ film 6 as a mask, the p-GaAs contact layer 5 and p-AlGaAs clad layer 4 are partially etched.

Figure 2D:
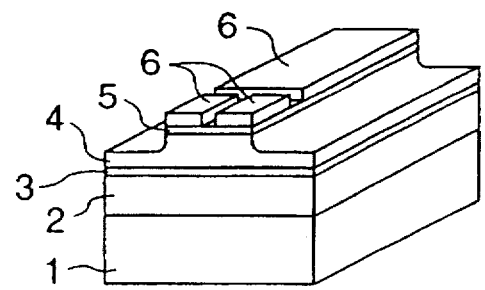
Figure 2E:
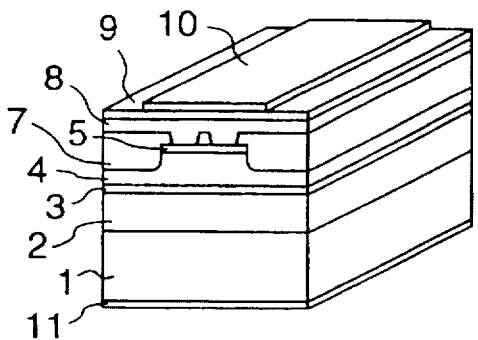

Next, the $SiO_2$ film 6 is etched to form a pattern shown in FIG. 2D. By using this pattern as a mask, an n-GaAs block layer 7 is selectively grown as shown in FIG. 2E. After removing the $SiO_2$ film 6, the p-AlGaAs buried layer 8 and p-GaAs cap layer 9 are sequentially formed. On the surface of the p-GaAs cap layer 9, a top electrode 10 is formed, and on the bottom surface of the n-GaAs substrate 1 a bottom electrode 11 is formed.

Figure 2F:
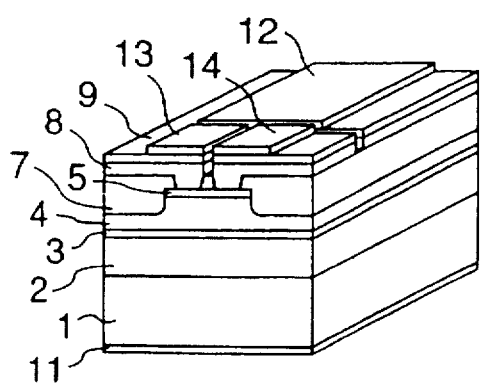

Lastly, as shown in FIG. 2F, separation trenches are formed in the top electrode 10, p-GaAs cap layer 9, and p-AlGaAs buried layer 8 to divide the top electrode 10 into the main electrode 12 and the subsidiary electrodes 13 and 14. The wafer formed in the above manner is cleavaged into a predetermined size to complete the semiconductor laser device having the structure shown in FIG. 1. The cleavage facet functions as a reflection member for reflecting light into the active layer.

The control of the shape of a laser radiation wave front of the semiconductor laser device will be described with reference to FIGS. 3A to 3D. How the shape of a normal laser radiation wave front is generated will be described with reference to solid lines shown in FIGS. 3A to 3D.

Figure 3A:
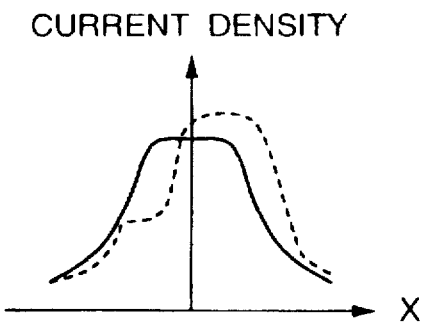
FIGS. 3A to 3D are diagrams illustrating the operation principle of the semiconductor laser device shown in FIG. 1.
Figure 3B:
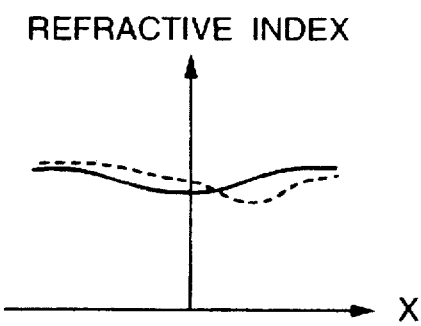
Figure 3C:
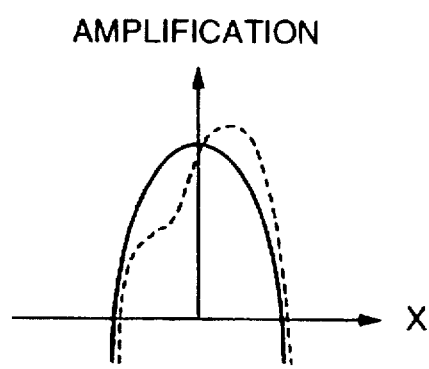
Figure 3D:
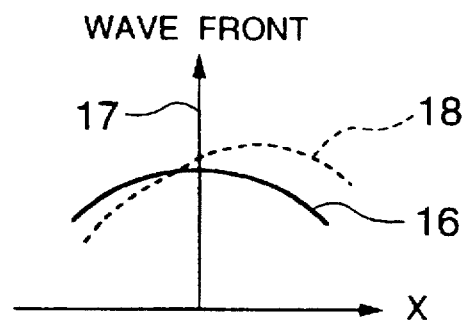

Current having a predetermined amount larger than a threshold value is injected into the main electrode 12 (refer to FIG. 1), and current of the same amount is injected into the two subsidiary electrodes 13 and 14. In this condition, an electron density becomes high at the center of the stripe as shown in FIG. 3A so that the refractive index distribution becomes small at the center of the stripe as shown in FIG. 3B. The amplification distribution becomes as shown in FIG. 3C. Since light generated by current injection is confined in the amplification distribution, the shape of a laser radiation wave front 16 of the semiconductor laser device 15 is symmetrical relative to the optical axis 17 as shown in FIG. 3D.

Next, how the shape of a laser radiation wave front is changed will be described with reference to broken lines shown in FIGS. 3A to 3D. In order to change the shape of a laser radiation wave front, injection current to the two subsidiary electrodes 13 and 14 are changed. In the example shown in FIG. 3A, a larger injection current is supplied to the right subsidiary electrode 14, and a smaller injection current is supplied to the left subsidiary electrode 13. As shown in FIG. 3B, the refractive index lowers at the high electron density area at the right in FIG. 3B, so that a light propagation speed becomes fast and the phase advances. Therefore as shown in FIG. 3D, the shape of a laser radiation wave front 18 having an advanced phase can be obtained on the side of the subsidiary electrode 14 supplied with a larger injection current. In this manner, the shape of a laser radiation wave front can be changed in accordance with the injection current amount supplied to the two subsidiary electrodes 13 and 14.

The injection current supplied to the subsidiary electrodes 13 and 14 is sufficient if it has an amount capable of changing the shape of a laser radiation wave front of light generated by the main electrode 12. The amount of the injection current is smaller than that supplied to the main electrode 12.

In this embodiment, two subsidiary electrodes are used. The number of subsidiary electrodes may be three or more in order to change finely the shape of a laser radiation wave front.

The invention is not limited to the above embodiment, but is applicable also to so-called refractive index waveguide type semiconductor laser devices and amplification waveguide type semiconductor laser devices.

Figure 4:
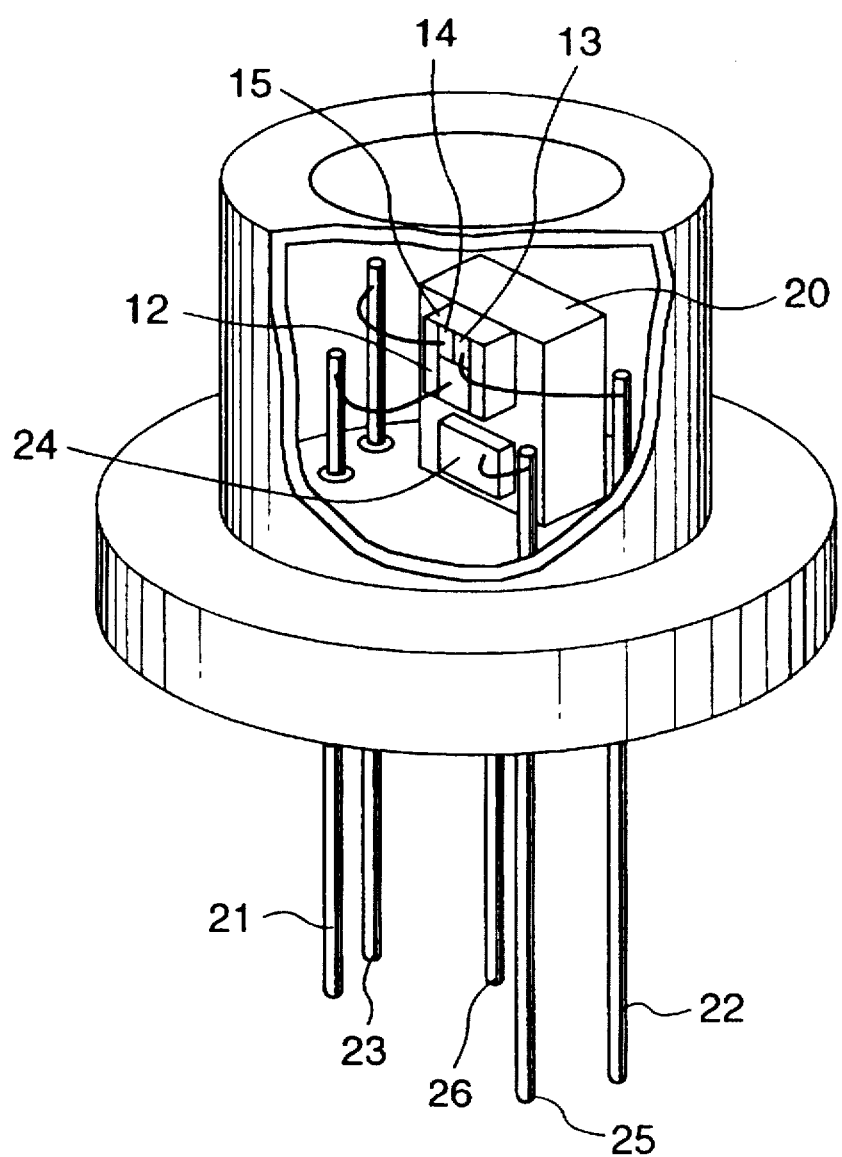
FIG. 4 is a diagram showing the overall structure of a semiconductor laser device package.

Such a semiconductor laser device is practically used by sealing it in a hermetic package in order to improve the resistance to environments and make easy to handle. FIG. 4 shows the structure of the semiconductor laser device sealed in a hermetic package. As shown, a semiconductor laser device 15 is fixed to a heat sink 20. The main electrode 12 and subsidiary electrode 13 and 14 are connected via bonding wires to leads 21, 22, and 23 for current supply thereto. In this package, a photodetector 24 is mounted at the back of the semiconductor laser device 15 in order to monitor the amount of light generated by the semiconductor laser device 15. An output of the photodetector 24 is supplied to the outside via a lead 25 connected via a bonding wire to the photodetector 24. The bottom electrode of the semiconductor laser device 15 and the bias electrode of the photodetector 24 are connected in common to a lead 26 to which a predetermined bias potential is applied.

In this example, although the bottom electrode of the semiconductor laser device 15 and the bias electrode of the photodetector 24 are connected in common to have the same potential, they may be supplied with different potentials. In this case, two leads are necessary for the connection to the bottom electrode of the semiconductor laser device 15 and the bias electrode of the photodetector 24, increasing the number of leads by one. However, in this case, if the bias potential of the photodetector 24 is made high, the response speed of the photodetector 24 can be improved.

Next, an embodiment of an optical disk drive using such a semiconductor laser device will be described with reference to FIG. 5. In the optical disk drive of this embodiment, an aberration to be caused by an inclination between an optical disk and an objective lens is corrected.

Figure 5:
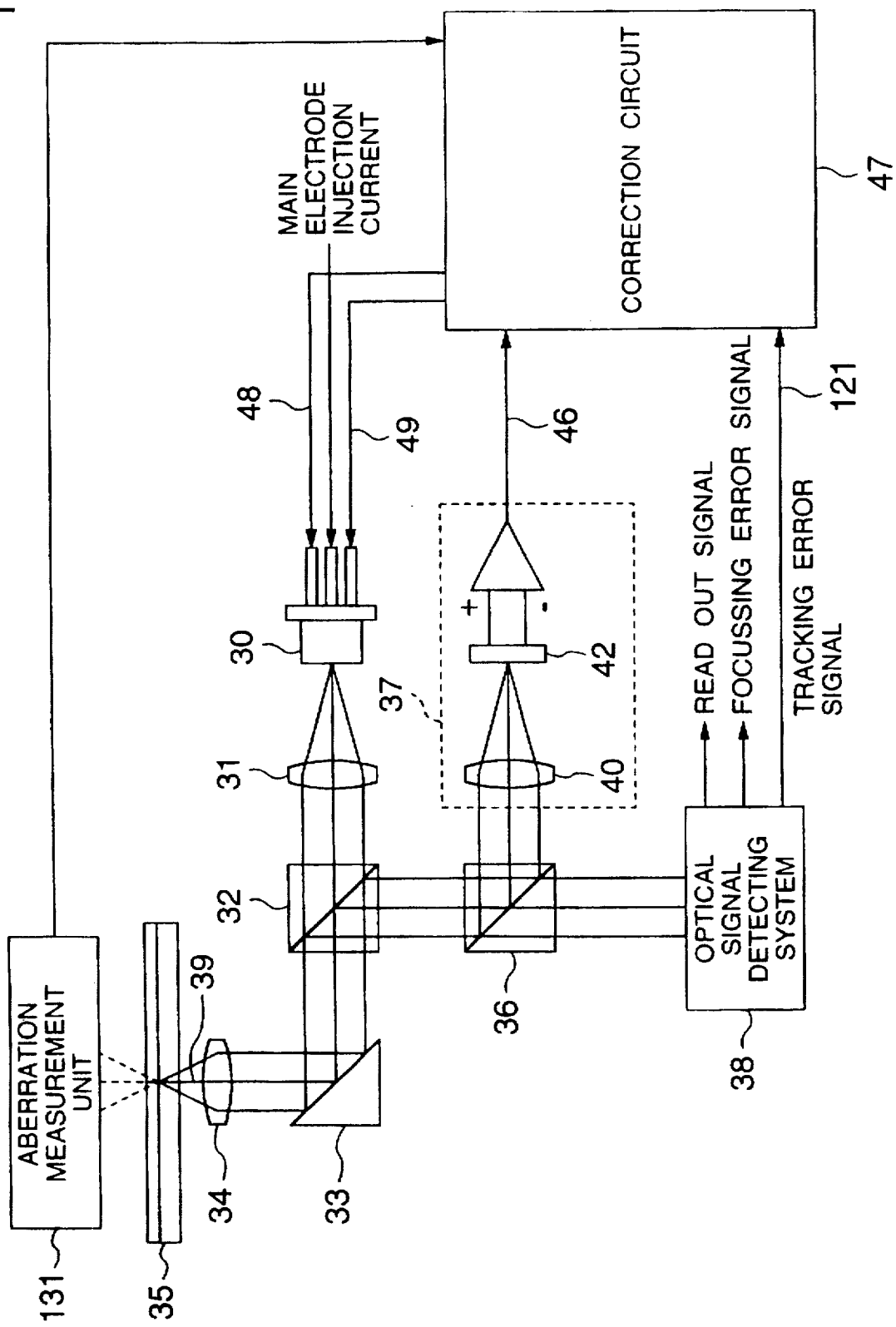
FIG. 5 is a diagram showing the structure of an optical disk drive according to an embodiment of the invention.

Referring to FIG. 5, a semiconductor laser light source 30 uses the semiconductor laser light source shown in FIG. 4. Light from the semiconductor laser light source 30 is made parallel by a collimator lens 31, passed through a beam splitter 32, reflected by a lifting mirror 33, and focussed by an objective lens 34 onto an optical disk 35. Light reflected by the optical disk 35 is again passed through the objective lens 34 and reflected by the lifting mirror 33 and beam splitter 32. This reflected light is divided into two beams by the beam splitter 36, one beam propagating toward an aberration detector 37 and the other beam propagating toward a signal detection optical system 38. Detected in the signal detection optical system 38 are a read out signal of data recorded in the optical disk 35, a focussing error signal representative of an error in the focussing direction of the optical disk 35 and objective lens 34, and a tracking error signal representative of a shift between the spot center of light focussed by the objective lens 34 and the track center of the optical disk 35.

In this embodiment, although an infinite optical system used by a magneto-optical disk drive or the like is used, a finite optical system used by a compact disk drive or the like may be used. The operation of the latter is the same as the former.

In FIG. 5, the optical disk 35 is positioned vertically to the optical axis 39. In this case, light focussed by a lens 40 forms a light spot at the center of a two-division photodetector 42. This spot is shown by a solid line in FIG. 6. As seen from FIG. 6, the focussed spot 41 is formed at the center of the two-division photodetector 42.

Figure 6:
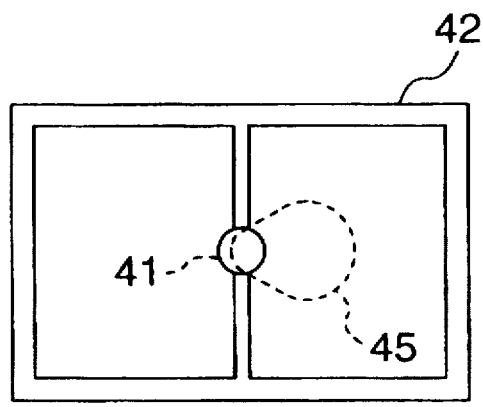
FIG. 6 is a diagram showing a focussed spot on a two-division photodetector.

Next, the optical disk 35 inclined relative to the optical axis 39 will be described with reference to FIG. 7. Since the objective lens 34 inclined relative to the optical axis is equivalent to the above case, in the following, the inclined optical disk 35 will be described by way of example. In this case, a coma given by the equation (1) is generated. Specifically, as shown by a broken line in FIG. 7, the shape of a laser radiation wave front 44 is formed by the coma on the objective lens pupil 43. If light having such a coma is focussed by the lens 40 of the aberration detector 37, a deformed spot is formed on the two-division photodetector 42. This spot is shown in FIG. 6 by a broken line. As shown, the focussed spot 45 on the two-division photodetector 42 is shaped like an extended tail. Therefore, a detection output at each area of the two-division photodetector 42 becomes different. This difference signal 46 is output as a signal representative of a coma caused by the inclination of the optical disk 35.

In accordance with this coma, an aberration correction circuit 47 controls the current to be supplied to the subsidiary electrodes of the semiconductor laser device. For the simplicity of drawing of FIG. 7, the semiconductor laser light source 30 is shown in a broken view and only the lead 21 to the main electrode 12 and the leads 22 and 23 to the subsidiary electrodes 13 and 14 are shown.

In accordance with the coma amount indicated by the broken line in FIG. 7, the aberration correction circuit 47 reduces the injection current 48 to the subsidiary electrode 13 and increases the injection current 49 to the subsidiary electrode 49. Therefore, the shape of a laser radiation wave front 50 having a phase advanced on the subsidiary electrode 14 side can be obtained. This wave front corresponds to the shape of a laser radiation wave front 51 (solid line) having the phase advanced on the right side as viewed in FIG. 7 on the objective pupil 43. This phase is opposite to the wave front 44 indicated by the broken line in FIG. 7 so that the aberration can be corrected. Accordingly, the light spot on the optical disk 35 becomes sufficiently small and a good read/write is possible.

Next, an optical disk drive according to another embodiment of the invention will be described with reference to FIG. 8. Also in this embodiment, the semiconductor laser light source used by the optical disk drive described above is used. In this embodiment, however, the correction is performed basing upon not the aberration but the inclination between an optical disk and an objective lens. Therefore, instead of the aberration detector 37 (refer to FIG. 5), an inclination detector 60 is provided as shown in FIG. 8.

Light from the semiconductor laser light source 30 is made parallel by a collimator lens 31, passed through a beam splitter 32, reflected by a lifting mirror 33, and focussed by an objective lens 34 onto an optical disk 35. Light reflected by the optical disk 35 is again passed through the objective lens 34 and reflected by the lifting mirror 33 and beam splitter 32. The light reflected by the beam splitter 32 propagates toward a signal detection optical system 38. Detected in the signal detection optical system 38 are a read out signal of data recorded in the optical disk 35, a focussing error signal representative of an error in the focussing direction of the optical disk 35 and objective lens 34, and a tracking error signal representative of a shift between the spot center of light focussed by the objective lens 34 and the track center of the optical disk 35.

Figure 8:
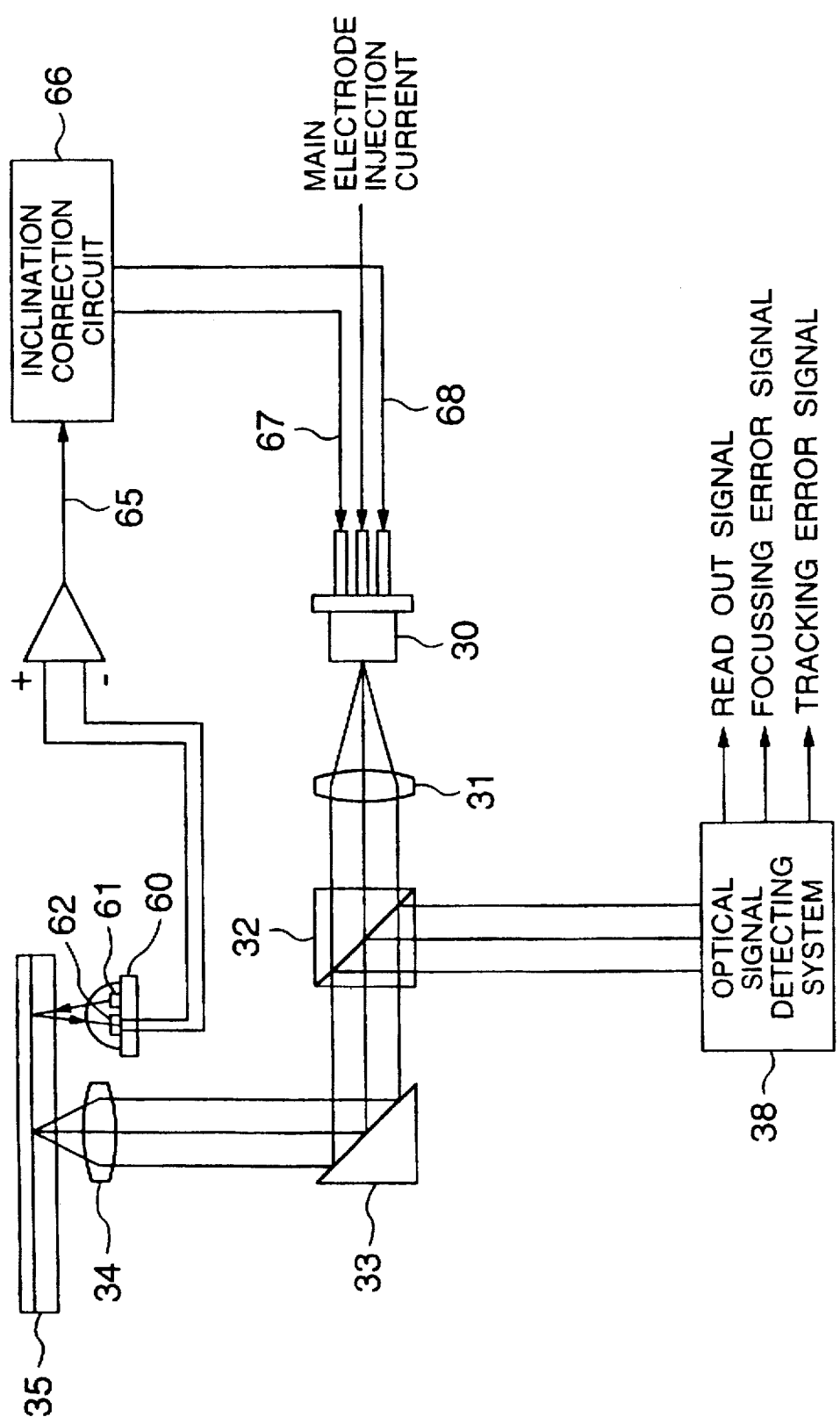
FIG. 8 is a diagram showing the structure of an optical disk drive according to another embodiment of the invention.

In this embodiment shown in FIG. 8, although an infinite optical system used by a magneto-optical disk drive or the like is used, a finite optical system used by a compact disk drive or the like may be used. The operation of the latter is the same as the former.

Figure 9:
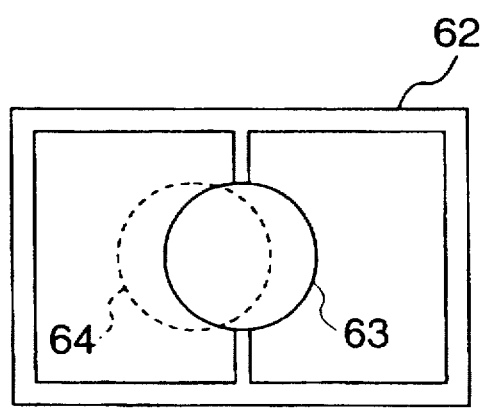
FIG. 9 is a diagram showing a light spot reflected from an optical disk on a two-division photodetector.

The inclination detector 60 is disposed near the objective lens 34 and constituted by a light emitting element 61 such as a light emitting diode and a two-division photodetector 62. The inclination detector 60 emits light toward the optical disk 35, and the light reflected from the optical disk 35 is received by the two-division photodetector 62. If there is no inclination of the optical disk 35, the light 63 reflected by the optical disk is at the center of the two-division photodetector 62 as indicated by the solid line in FIG. 9, whereas if there is any inclination of the optical disk 35, the light 64 reflected by the optical disk 35 shifts to one side of the two-division photodetector 62 as indicated by the broken line in FIG. 9, so that there is a difference in light amount detected at each area of the two-division photodetector 62. As shown in FIG. 8, this difference signal 65 is output as the signal representative of the inclination amount of the optical disk.

In accordance with this inclination amount of the optical disk, the inclination correction circuit 66 controls the current amounts 67 and 68 to be supplied to the subsidiary electrodes of the semiconductor laser device. Therefore, the shape of a laser radiation wave front of the semiconductor laser device is changed to correct the coma generated by the inclination of the optical disk 35. The operation principle is the same as the embodiment described with FIG. 5.

Figure 10A:
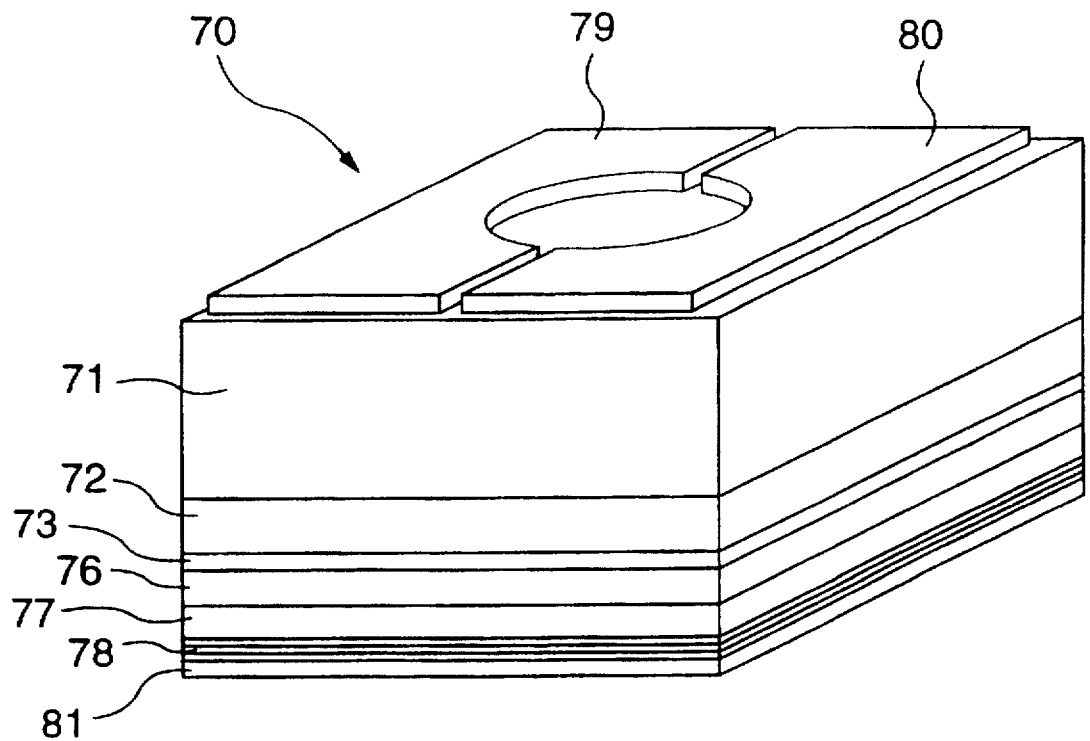
FIG. 10A is a diagram showing the overall structure of a semiconductor laser device according to another embodiment of the invention.
Figure 10B:
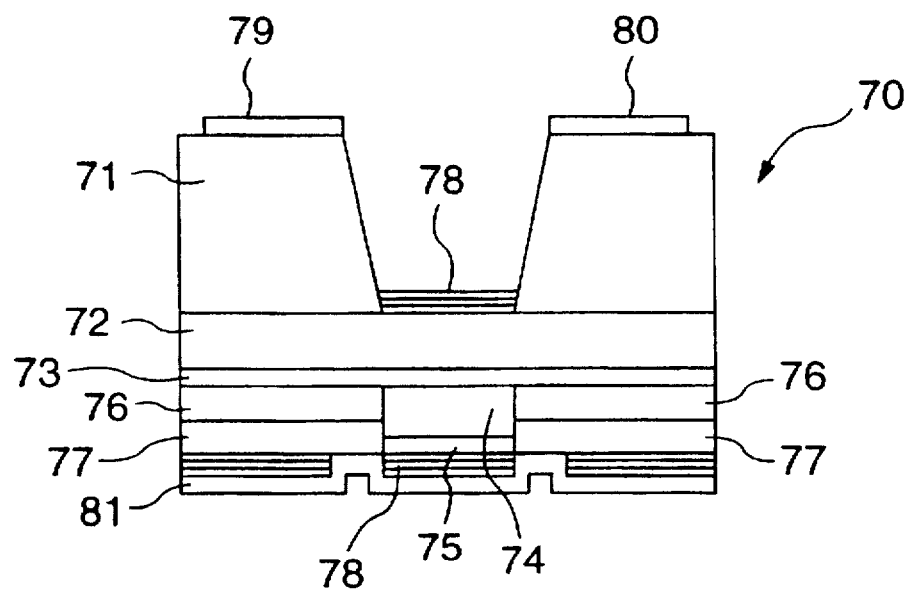
FIG. 10B is a cross sectional view of the semiconductor laser device shown in FIG. 10B.
Figure 11:
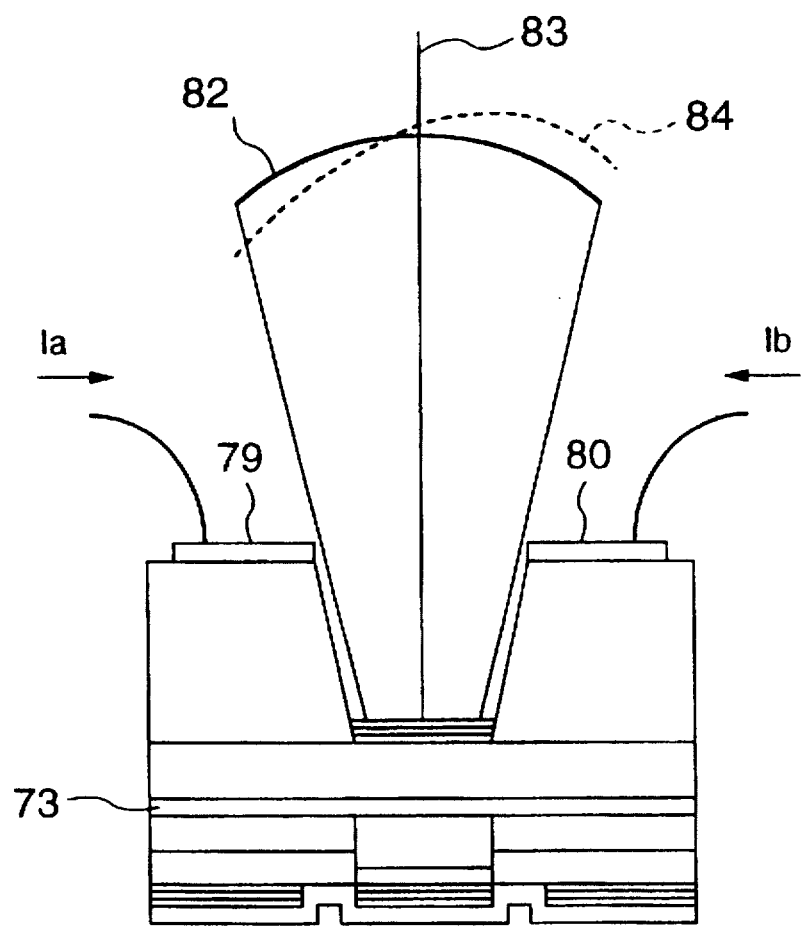
FIG. 11 is a diagram illustrating the operation principle of the semiconductor laser device shown in FIGS. 10A and 10B.

FIGS. 10A, 10B and 11 show another embodiment of a semiconductor laser device of the invention.

The semiconductor laser devices described above are of the type that light is emitted in the direction parallel to the junction surface of semiconductor crystals. The semiconductor laser device of this embodiment is of the type that light is emitted in the direction vertical to the junction surface of semiconductor crystals, and can change the laser surface radiation wave front. FIG. 10A is a diagram showing the overall structure of the semiconductor laser device of this embodiment, and FIG. 10B is a cross sectional view of the semiconductor laser device shown in FIG. 10A. FIG. 11 is a diagram illustrating the operation principle.

With reference to FIGS. 10A and 10B, the method of manufacturing a semiconductor laser device of this embodiment and the structure thereof will be described.

First, on an n-GaAs substrate 71, crystals of an n-AlGaAs clad layer 72, p-GaAs active layer 73, p-AlGaAs clad layer 74, and p-AlGaAs cap layer 75 are sequentially grown. Next, a circular SiO$_2$ film is formed on the p-AlGaAs cap layer 75 through chemical vapor deposition and photolithography. By using this SiO$_2$ film as a mask, the p-AlGaAs cap layer 75 and p-AlGaAs clad layer 74 are selectively etched. Thereafter, an n-GaAs block layer 76 and a p-GaAs layer 77 are selectively grown to bury the circular area. After the SiO$_2$ film is removed, the n-GaAs substrate 71 on the emission side is selectively etched. Two divided top electrodes 79 and 80 are formed on the top surface of the semiconductor laser device, and a multi-layer reflection mirror 78 and a bottom electrode 81 are formed on the bottom surface to complete the semiconductor laser device shown in FIG. 10A.

The control of the shape of a laser radiation wave front of the semiconductor laser device will be described. First, how the shape of a normal laser radiation wave front is generated will be described with reference to a solid line shown in FIG. 11. Injection currents Ia and Ib having the same amount are supplied to the two top electrodes 79 and 80. Therefore, the current density in the active layer 73 becomes uniform, and the shape of a laser radiation wave front 82 is in rotation symmetry with the optical axis 83.

Next, how the shape of a laser radiation wave front is changed will be described with reference to a broken line shown in FIG. 11. Injection currents to the two top electrodes 79 and 80 are changed. In the example indicated by the broken line in FIG. 11, a larger injection current Ib is supplied to the right top electrode 80 at the right side in FIG. 11, and a smaller injection current Ia is supplied to the left top electrode 79. Therefore, the refractive index lowers at the high electron density area at the right in FIG. 11, so that a light propagation speed becomes fast and the phase advances. Specifically, the shape of a laser radiation wave front 84 having an advanced phase can be obtained on the side of the top electrode 80 supplied with a larger injection current. In this manner, the shape of a laser radiation wave front can be changed in accordance with the injection current amount supplied to the two top electrodes.

Figure 12:
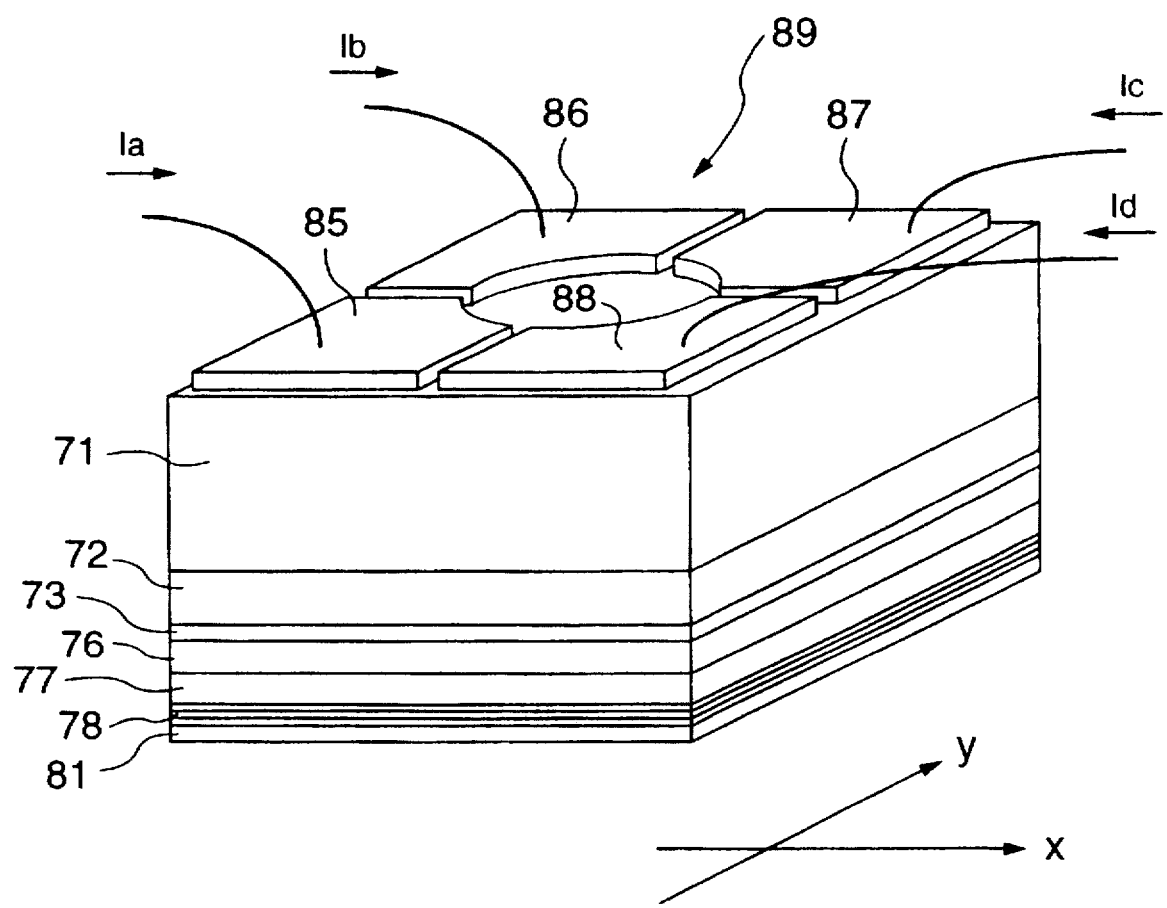
FIG. 12 is a diagram showing the overall structure of a semiconductor laser device according to another embodiment of the invention.

In the embodiment shown in FIGS. 10A, 10B, and 11, the two top electrodes are used. Four top electrodes may be used as shown in FIG. 12. In this case, the shape of a laser radiation wave front can be changed in two directions, x- and y-directions. For example, the shape of a laser radiation wave front can be changed in the x-direction by a difference between the injection current (Ia+Ib) to the top electrodes a85 and b86 and the injection current (Ic+Id) to the top electrodes c87 and d88. On the other hand, the shape of a laser radiation wave front can be changed in the y-direction by a difference between the injection current (Ia+Id) to the top electrodes a85 and d88 and the injection current (Ib+Ic) to the top electrodes b86 and c87. With a combination of the above two cases, the shape of a laser radiation wave front can be changed freely in the x-y plane. Accordingly, with the configuration shown in FIG. 12, it becomes possible to provide the semiconductor laser device 89 capable of changing the shape of a laser radiation wave front in the plane vertical to the optical axis in waveguide.

The semiconductor laser device shown in FIGS. 10A and 10B or in FIG. 12 may be mounted on an optical disk drive to correct an inclination between an optical disk and an objective lens. In this case, the optical disk drive shown in FIG. 5 or 8 uses a semiconductor laser light source of the semiconductor laser device shown in FIGS. 10A and 10B or in FIG. 12, instead of the semiconductor laser light source 30. The other structures are the same as described above. With this arrangement, an aberration caused by an inclination of an optical disk can be corrected with similar operations discussed above.

If the semiconductor laser device 89 shown in FIG. 12 is used, the shape of a laser radiation wave front can be changed in two directions. Therefore, the aberration can be corrected in two directions, radial and tangent directions of an optical disk.

Also the semiconductor laser devices shown in FIGS. 10A and 10B and in FIG. 12 each are accommodated in a hermetically sealed package. In this case, leads are connected to the top electrodes and bottom electrode. If a photodetector is mounted in the package, leads are connected to the photodetector. One of the electrodes of the photodetector is connected to a lead. The other may be connected to a lead in common with the bottom electrode or may be connected independently.

Next, another embodiment of the optical disk drive of this embodiment will be described with reference to FIG. 5.

In this embodiment, a tracking control of the optical disk drive is executed by using the semiconductor laser device.

In this embodiment, the semiconductor laser light source 30 may use any of the semiconductor laser devices and semiconductor laser light sources described previously. It is assumed in this embodiment that the semiconductor laser device shown in FIG. 1 and used with the optical disk drive described previously is used.

Light from the semiconductor laser light source 30 is made parallel by the collimator lens 31, passed through the beam splitter 32, reflected by the lifting mirror 33, and focussed by the objective lens 34 onto the optical disk 35. Light reflected by the optical disk 35 is again passed through the objective lens 34 and reflected by the lifting mirror 33 and beam splitter 32. This light reflected by the beam splitter 32 propagates toward the signal detection optical system 38. Detected in the signal detection optical system 38 are a read out signal of data recorded in the optical disk 35, a focussing error signal representative of an error in the focussing direction of the optical disk 35 and objective lens 34, and a tracking error signal 121 representative of a shift between the spot center of light focussed by the objective lens 34 and the track center of the optical disk 35.

In this embodiment, although an infinite optical system used by a magneto-optical disk drive or the like is used, a finite optical system used by a compact disk drive or the like may be used. The operation of the latter is the same as the former.

In accordance with the detected tracking error signal 121, the aberration correction circuit 47 controls the currents 48 and 49 to be supplied to the subsidiary electrodes of the semiconductor laser device. In this manner, the intensity distribution of laser radiation changes so that the position of a light spot on the optical disk 35 can be changed finely. Accordingly, in this embodiment, a fine tracking control can be electrically executed and a positioning precision can be improved.

Next, another embodiment of the optical disk drive of this embodiment will be described with reference to FIG. 5. In this embodiment, an optical axis of an optical pickup unit is adjusted by using the semiconductor laser device.

In this embodiment, the semiconductor laser light source 30 may use any of the semiconductor laser devices and semiconductor laser light sources described previously. It is assumed in this embodiment that the semiconductor laser device shown in FIG. 1 and used with the optical disk drive described previously is used.

In this embodiment, although an infinite optical system used by a magneto-optical disk drive or the like is used, a finite optical system used by a compact disk drive or the like may be used. The operation of the latter is the same as the former.

Light from the semiconductor laser light source 30 is made parallel by the collimator lens 31, passed through the beam splitter 32, reflected by the lifting mirror 33, and focussed by the objective lens 34 onto the optical disk 35. An aberration measurement unit 131 measures an aberration of light focussed with the objective lens 34.

With a conventional optical axis adjusting method, the position of the objective lens 34 is manually adjusted to make the aberration amount as small as possible in a trial-and-error basis. In contrast, in this embodiment, after the objective lens 34 is roughly positioned in the degree of about mechanical precision, the injection current amounts 48 and 49 to the subsidiary electrodes of the semiconductor laser device are controlled by the aberration control circuit 47 so as to minimize the aberration amount measured with the aberration measurement unit 121. By setting the injection current amounts to the subsidiary electrodes of the semiconductor laser device in this manner, the optical axis of the light pickup unit can be adjusted easily, shortening the adjustment work time and reducing the cost.

Figure 13:
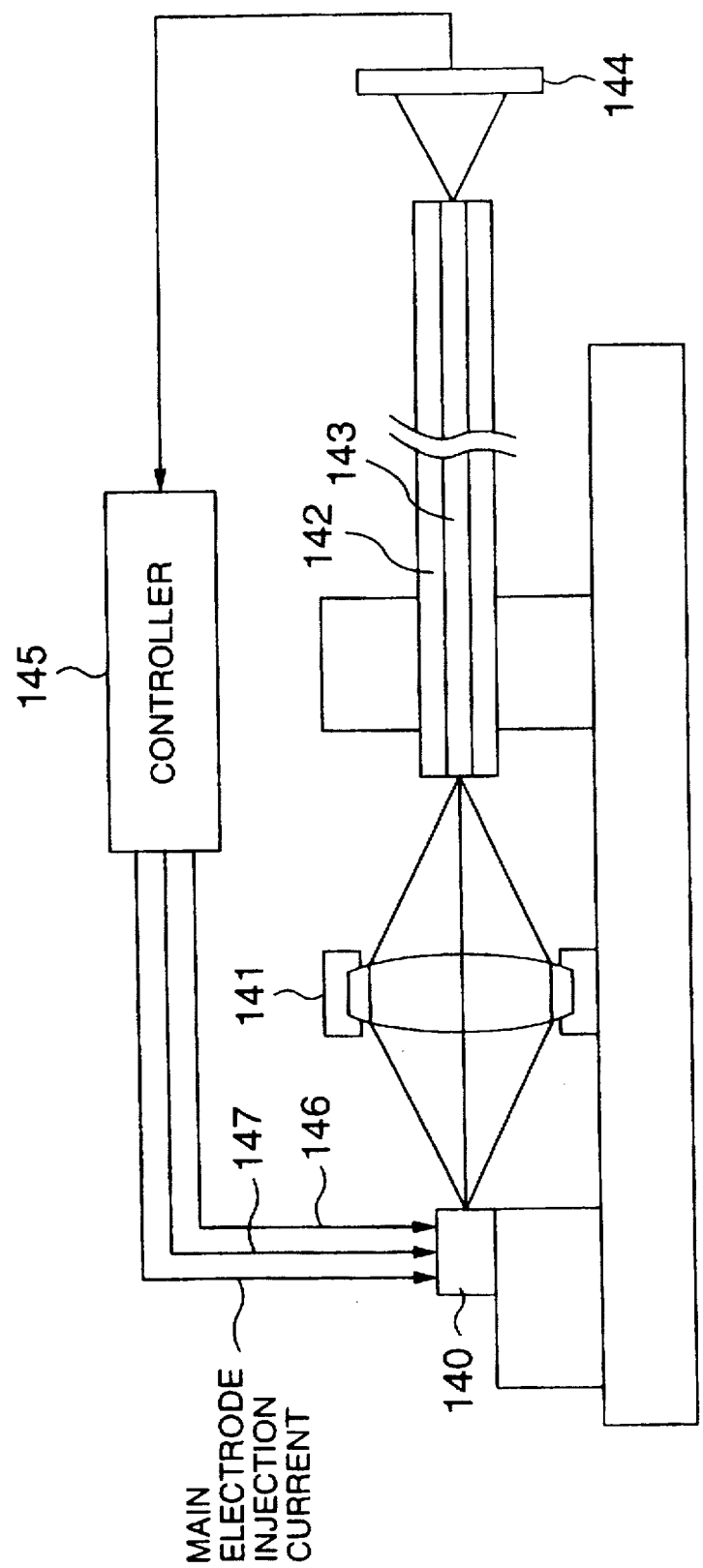
FIG. 13 is a diagram illustrating an optical axis adjusting method for a semiconductor laser device and an optical fiber.

Next, an embodiment of an optical axis adjustment of the semiconductor laser device and an optical fiber will be described. In FIG. 13, the semiconductor laser device 140 may use any of the semiconductor laser devices described previously. It is assumed in this embodiment that the semiconductor laser device shown in FIG. 1 is used.

In the field of optical communications, it is necessary to couple light emitted from the semiconductor laser device with an optical fiber 142. For such a coupler, the structure shown in FIG. 13 is used. In this structure, light emitted from the semiconductor laser device 140 is focussed by a lens 141 and coupled to the core 143 of the optical fiber 142. It is desirable that the coupling efficiency of the optical fiber 142 is as high as possible. To this end, it is necessary to perform the optical axis adjustment between the semiconductor laser device 140 and the optical fiber 142 at high precision. The diameter of the core 143 of the optical fiber 142 is in the range from several micrometers to several tens micrometers. Therefore, the position alignment precision of the semiconductor laser device 140 and optical fiber 142 is required to be several micrometers.

Conventionally, an optical axis is adjusted manually to maximize the coupling efficiency to the optical fiber in a trial-and-error basis. In contrast, in this embodiment, after the optical fiber 142 and semiconductor laser device 140 are roughly positioned in the degree of about mechanical precision, the injection current amounts to the subsidiary electrodes of the semiconductor laser device are controlled to change the optical axis in the waveguide. In this case, a photodetector 144 detects the light amount coupled to the optical fiber 142 and a controller 145 sets the injection current amounts 146 and 147 to the subsidiary electrodes of the semiconductor laser device 140 to maximize the coupled light amount. In this manner, the optical axis adjustment of the semiconductor laser device and optical fiber can be performed easily, shortening the adjustment work time and reducing the cost.

Next, a current injection method for a semiconductor laser device of this invention will be described. The current injection method described earlier injects current independently into the main electrode and subsidiary electrodes. This method, however, is associated with some problem of an increase in the number of leads for current supply.

Figure 14:
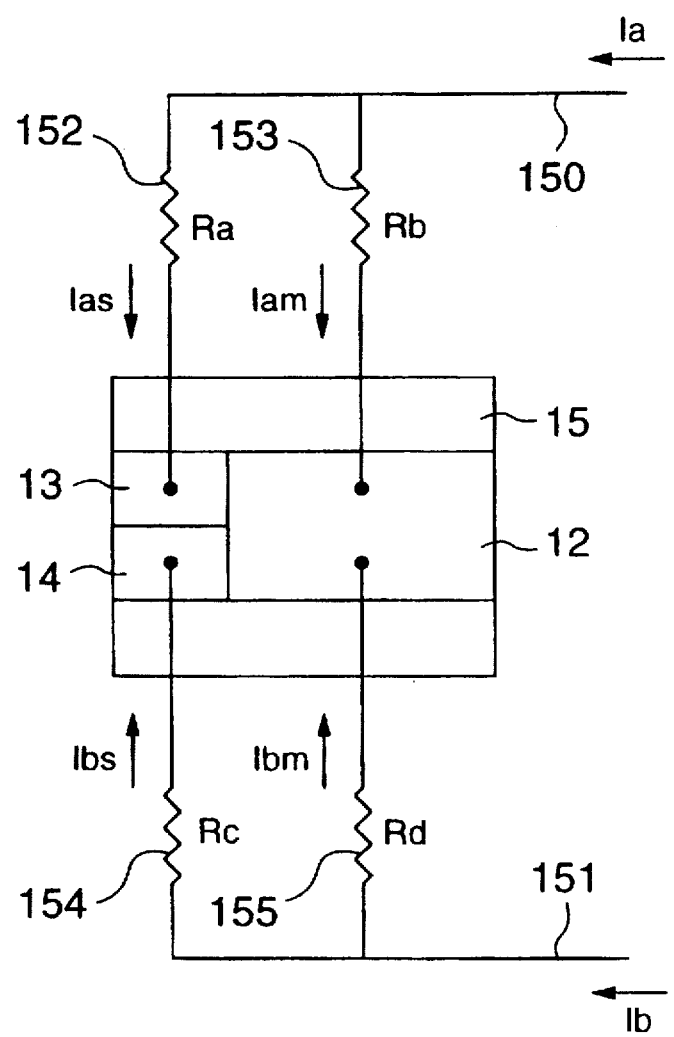
FIG. 14 is a diagram showing the structure of a semiconductor laser device according to another embodiment of the invention.

In contrast, in the semiconductor laser device of this embodiment, the number of leads can be reduced. FIG. 14 shows a circuit configuration of this embodiment. In FIG. 14, the semiconductor laser device 15 has the same structure as that shown in FIG. 1. In the current supply circuit for the semiconductor laser device 15, two current paths are provided including a first current supply path 150 and a second current supply path 151.

An injection current Ia from the first current supply path 150 is branched via resistors Ra152 and Rb153 into an injection current Ias to the subsidiary electrode 13 and an injection current Iam to the main electrode 12. An injection current Ib from the second current supply path 151 is branched via resistors Rc154 and Rd155 into an injection current Ibs to the subsidiary electrode 14 and an injection current Ibm to the main electrode 12. A total of the injection current to the main electrode 12 is Iam+Ibm.

In order to obtain the shape of a normal laser radiation wave front, the injection currents Ias and Ibs to the subsidiary electrodes 13 and 14 are made equal. Therefore, the current density distribution in the active layer becomes uniform, and the shape of a laser radiation wave front becomes symmetrical with the optical axis.

In order to change the shape of a laser radiation wave front, the injection currents Ias and Ibs to the subsidiary electrodes 13 and 14 are changed. For example, in order to increase the injection current Ias to the subsidiary electrode 13, the injection current Ia to the first current supply path 150 is increased. In this case, the injection current Iam to the main electrode 12 increases. In order to make the total injection current to the main electrode 12 constant, the injection current Ib to the second current supply path 151 is reduced and the injection current Ibm to the main electrode 12 is reduced. In this case, the injection current Ibs to the subsidiary electrode 14 also reduces. As a result, the injection current Ias to the subsidiary electrode 13 becomes large and the injection current Ibs to the subsidiary electrode 14 becomes small, so that the shape of a laser radiation wave front having an advanced phase on the side of the subsidiary electrode 13 can be obtained. Conversely, if the injection current Ib to the second current supply path 151 is made large and the injection current Ia to the first current supply path 150 is made small, the shape of a laser radiation wave front having an advanced phase on the side of the subsidiary electrode 14 can be obtained.

In this embodiment, with the configuration shown in FIG. 14, the number of leads to the semiconductor laser device for current supply is two, being able to be reduced.

As described so far, according to the present invention, the shape of a laser radiation wave front can be changed easily by controlling the current amounts to be injected to the semiconductor laser device.

If the semiconductor laser device is mounted on an optical disk drive, an aberration caused by an inclination of an optical disk can be corrected by controlling the current amounts to be injected to the semiconductor laser device in accordance with the inclination between the optical disk and an objective lens to thereby change the shape of a laser radiation wave front. In this manner, even if the numerical aperture of an objective lens is made large, a high density optical disk drive can be realized which can correct an inclination of an optical disk easily.

By using the semiconductor laser device, the optical axis adjustment of an optical pickup unit and an optical fiber can be simplified.

What is claimed is:

1. A semiconductor laser device made of semiconductor crystals having an active layer for performing light amplification through current injection and guiding light in waveguide, a reflection member for reflecting light into said active layer, and a top electrode and a bottom electrode used for current injection to said active layer, wherein current is injected from said top electrode to said bottom electrode to emit laser radiation in the direction perpendicular to a junction surface of the semiconductor crystals, characterized in that:

said top electrode is divided into a plurality of electrodes and each of the plurality of divided electrodes is independently supplied with current.

2. An optical disk drive having an optical disk, a semiconductor laser light source for emitting a laser beam, an optical focussing system for focussing the laser beam from said semiconductor laser light source on said optical disk, and an optical detecting system for detecting the laser beam reflected from said optical disk, characterized in that:

said semiconductor laser light source includes a semiconductor laser device made of semiconductor crystals having an active layer for performing light amplification through current injection and guiding light in waveguide, a reflection member for reflecting light into said active layer, and a top electrode and a bottom electrode used for current injection to said active layer, wherein said top electrode is divided into a plurality of electrodes, and current is independently injected from each of the plurality of divided electrodes to said bottom electrode to emit laser radiation in the direction along the optical axis of the waveguide in said active layer;

wherein said optical disk drive further comprises:

aberration detecting means for detecting an aberration generated at said optical focussing system and said optical disk; and correction means for correcting said aberration by controlling injection current to said semiconductor laser device and changing the shape of a laser radiation wave front in accordance with an output of said aberration detecting means.

* * * * *